US008549728B2

(12) United States Patent  
Sato (10) Patent No.: US 8,549,728 B2
(45) Date of Patent: Oct. 8, 2013

(54) MANUFACTURING METHOD FOR VIBRATION BODY AND MANUFACTURING METHOD FOR VIBRATION ACTUATOR

(75) Inventor: Takahiro Sato, Yokohama (JP)

(73) Assignee: Nikon Corporation, Tokyo (JP)

( * ) Notice: Subject to any disclaimer, the term of this patent is extended or adjusted under 35 U.S.C. 154(b) by 138 days.

(21) Appl. No.: 12/884,463

(22) Filed: Sep. 17, 2010

(65) Prior Publication Data

US 2011/0002057 A1  Jan. 6, 2011

Related U.S. Application Data

(63) Continuation of application No. 12/047,687, filed on Mar. 13, 2008, now abandoned.

(30) Foreign Application Priority Data

Mar. 14, 2007  (JP) .................................. 2007-065126
Mar. 11, 2008  (JP) .................................. 2008-060499

(51) Int. Cl.
   *H04R 31/00* (2006.01)
(52) U.S. Cl.
   USPC ............... 29/594; 29/609.1; 29/831; 29/846; 73/504.04; 73/504.12; 73/504.16; 310/330; 310/332; 310/340; 310/344; 333/186; 333/187; 333/188; 333/189
(58) Field of Classification Search
   USPC ............ 29/592.1, 594, 595, 609.1, 831, 846; 73/504.04, 504.12–504.16; 310/330–332, 310/340, 344, 345; 333/186–189
   See application file for complete search history.

(56) References Cited

U.S. PATENT DOCUMENTS

| | | | |
|---|---|---|---|
| 5,256,928 A | 10/1993 | Nishikura et al. | |
| 5,650,810 A | 7/1997 | Muto | |
| 5,831,370 A | 11/1998 | Sugaya | |
| 7,514,845 B2 | 4/2009 | Ashizawa et al. | |
| 2004/0256951 A1* | 12/2004 | Fujimoto et al. | 310/317 |
| 2009/0313808 A1* | 12/2009 | Kato et al. | 29/594 |
| 2009/0313809 A1* | 12/2009 | Kato et al. | 29/594 |
| 2009/0320274 A1* | 12/2009 | Kato et al. | 29/596 |
| 2010/0207484 A1* | 8/2010 | Chang | 310/300 |

FOREIGN PATENT DOCUMENTS

| | | |
|---|---|---|
| JP | 63-220782 | 9/1988 |
| JP | 5-116329 | 5/1993 |
| JP | 6-171095 | 6/1994 |
| JP | 7-241091 | 9/1995 |

(Continued)

OTHER PUBLICATIONS

Japanese Office Action for corresponding JP Application No. 2008-060499, Sep. 25, 2012.

(Continued)

*Primary Examiner* — Paul D Kim
(74) *Attorney, Agent, or Firm* — Ditthavong Mori & Steiner, P.C.

(57) ABSTRACT

To provide a vibration actuator, a lens barrel, a camera, a manufacturing method for a vibration body and a manufacturing method for a vibration actuator, which have a high driving efficiency and can lead to easy manufacture. A vibration actuator of the present invention is provided with an elastic body and an electromechanical transducer element sintered onto the elastic body in the state that the element is divided into a plurality of areas by a groove-shaped border portion.

5 Claims, 5 Drawing Sheets

(56) References Cited

FOREIGN PATENT DOCUMENTS

| | | |
|---|---|---|
| JP | 2001-169571 | 6/2001 |
| JP | 2006-074878 | 3/2006 |
| JP | 2006-295147 | 10/2006 |

OTHER PUBLICATIONS

Japanese Decision to Grant a Patent for corresponding JP Application No. 2008-060499, Jun. 4, 2013.

* cited by examiner

MANUFACTURING METHOD FOR VIBRATION BODY AND MANUFACTURING METHOD FOR VIBRATION ACTUATOR

The disclosure of the following priority application is herein incorporated by reference: Japanese Patent Application No. 2007-065126 filed on Mar. 14, 2007 and No. 2008-060499 filed on Mar. 11, 2008, and this is a continuation of application Ser. No. 12/047,687 filed Mar. 13, 2008 now abandoned.

BACKGROUND OF THE INVENTION

1. Field of the Invention

The present invention relates to a vibration actuator, a lens barrel, a camera, a manufacturing method for a vibration body and a manufacturing method for a vibration actuator.

2. Description of the Related Art

A vibration actuator causes an electromechanical transducer element to expand and contract based on a driving signal, and using this expansion and contraction, generates a progressive vibrational wave (hereinafter, referred to as a progressive wave) into a driving surface of an elastic body. Then, the vibration actuator generates elliptic motion in the driving surface based on this progressive wave, and gives rise to a driving force by driving a relative displacement member that has been brought into pressure-contact with a crest of a wave of the elliptic motion.

In such vibration actuators, various improvements with respect to enhancement of the driving efficiency and other aspects have been achieved. The prior art (for example, see Japanese Unexamined Patent Application No. S63-220782) discloses an example of providing a partitioning border portion in a piezoelectric element main body, wherein the border portion comprises a notch taking the form of a groove in at least a part of the piezoelectric element in a thickness direction to partition the piezoelectric element for each electrode area.

However, the method disclosed in this prior art has the problem of a large number of manufacturing steps of the piezoelectric element leading to increases in production costs.

SUMMARY OF THE INVENTION

An object of the present invention is to provide a vibration actuator, a lens barrel, a camera, a manufacturing method for a vibration body and a manufacturing method for a vibration actuator, which have an enhanced driving efficiency and can be easily manufactured.

The present invention achieves said object by virtue of the means described below.

According to a first aspect of the present invention, there is provided a vibration actuator comprising: an elastic body provided on a vibration body; and an electromechanical transducer element sintered onto the elastic body in a state that the element is divided into a plurality of areas by a groove-shaped border portion.

The electromechanical transducer element may be separated into a plurality of independent areas by the border portion.

In the first aspect of the present invention, electrodes may be formed on a surface of the plurality of areas of the electromechanical transducer.

No electrode may be formed on a surface of an end portion other than an end portion touching the border portion of the plurality of areas.

The electromechanical transducer element may be manufactured by injection molding.

An interval on a surface of the electromechanical transducer element between adjacent areas of the plurality of areas may be 0.1 mm or less.

A movable body in pressure-contact with a face on an opposite side of a face where the electromechanical transducer element of the elastic body may be provided.

A pressurizing section generating a pressurizing force to pressure-contact the elastic body and the movable body, and provided on a face side on which the electromechanical transducer element of the elastic body may be provided.

According to a second aspect of the present invention, there is provided a lens barrel provided with the vibration actuator according to the first aspect of the present invention.

According to a third aspect of the present invention, there is provided a camera provided with the vibration actuator according to the first aspect of the present invention.

According to a fourth aspect of the present invention, there is provided a manufacturing method for a vibration body, comprising: a first step of providing an electromechanical transducer element on an elastic body in a state that the element is divided into a plurality of areas by a groove-shaped border portion; and a second step of sintering the elastic body and the electromechanical transducer element.

The first step may further comprise providing the electromechanical transducer element divided into a plurality of independent areas by the groove-shaped border portion.

After the second step, a third step of forming electrodes on a surface of the plurality of areas of the electromechanical transducer element may be comprised.

After the third step, a fourth step of polarizing the electromechanical transducer element for each of the plurality of areas may be comprised.

The first step may provide the electromechanical transducer element by injection molding.

In the first step, the electromechanical transducer element may be provided such that an interval between adjacent areas of the plurality of areas on a surface of the electromechanical transducer element is 0.1 mm or less.

A movable body may be provided in pressure-contact with a face on an opposite side of a face where the electromechanical transducer element of the elastic body is provided.

A pressurizing section generating a pressurizing force to pressure-contact the elastic body and the movable body may be provided on a face side on which the electromechanical transducer element of the elastic body is provided.

According to the present invention, it is possible to provide a vibration actuator, a lens barrel, a camera, a manufacturing method for a vibration body and a manufacturing method for a vibration actuator, which have an enhanced driving efficiency and can be easily manufactured.

DETAILED DESCRIPTION OF THE PREFERRED EMBODIMENT

Hereinafter, a more detailed description will be given with reference to the drawings and so on by way of an embodiment of the present invention. It should be noted that the following embodiment is described with an example of the use of an ultrasound motor utilizing a vibration area of an ultrasound wave as a vibration actuator.

Figure 1:
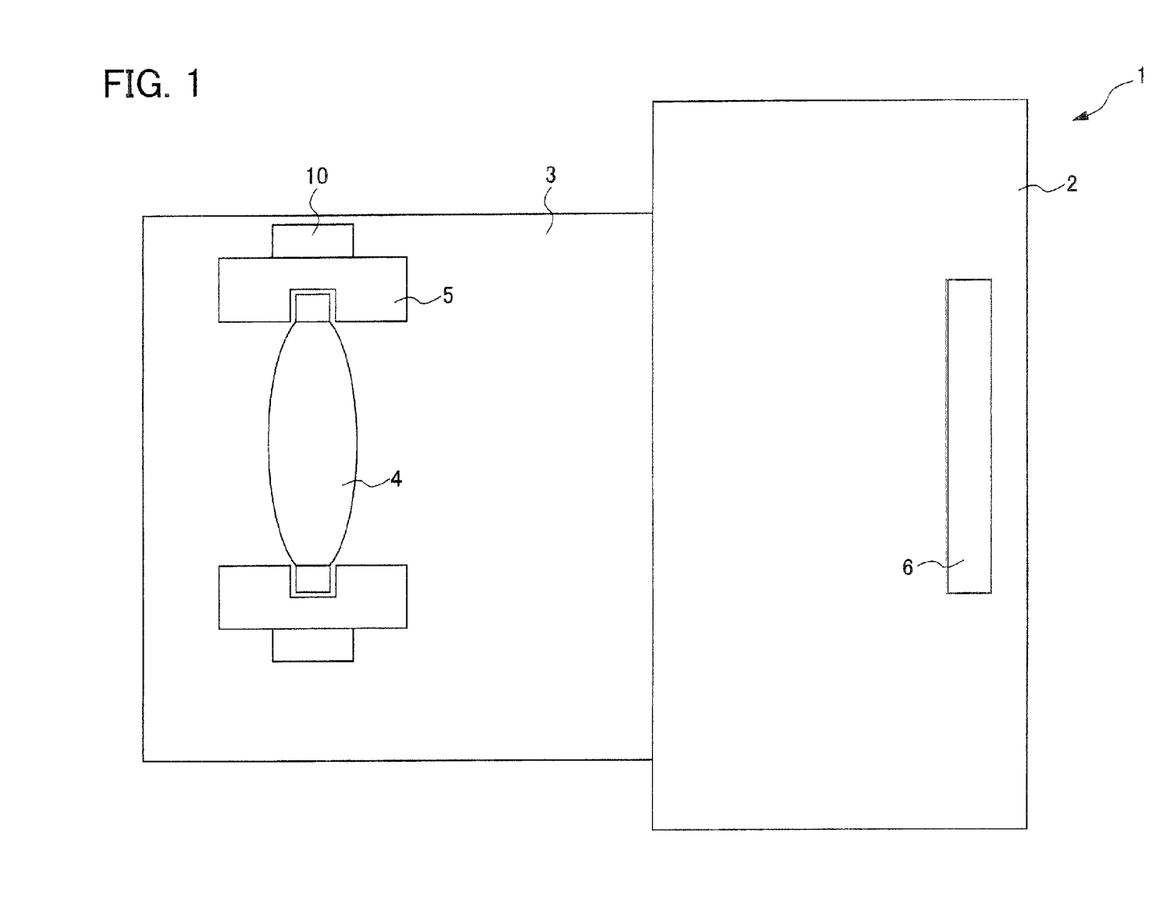
FIG. 1 is an illustration showing a camera using an ultrasound motor of the present embodiment.

FIG. 1 is an illustration showing a camera 1 using an ultrasound motor 10 of the present embodiment.

The camera 1 of the present embodiment is provided with a camera body 2 having an image pickup device 6, and a lens barrel 3. The lens barrel 3 is an interchangeable lens that is attachable to and detachable from the camera body 2. It should be noted that the camera 1 of the present embodiment forms an example for which the lens barrel 3 is an interchangeable lens, but the invention is not limited to this, and the lens barrel 3 may be, for example, a lens barrel formed in an integrated fashion with the camera body.

The lens barrel 3 is provided with a lens 4, a cam tube 5, an ultrasound motor 10 and so on. In the present embodiment, the ultrasound motor 10 is used as a driving source for driving the lens 4 during a focusing operation of the camera 1, and the driving force gained from the ultrasound motor 10 is transferred to the cam tube 5. The lens 4 is in cam-engagement with the cam tube 5, and if the cam tube 5 rotates by the driving force of the ultrasound motor 10, then the lens 4 moves based on the cam-engagement with the cam tube 5 so as to perform focusing.

Figure 2:
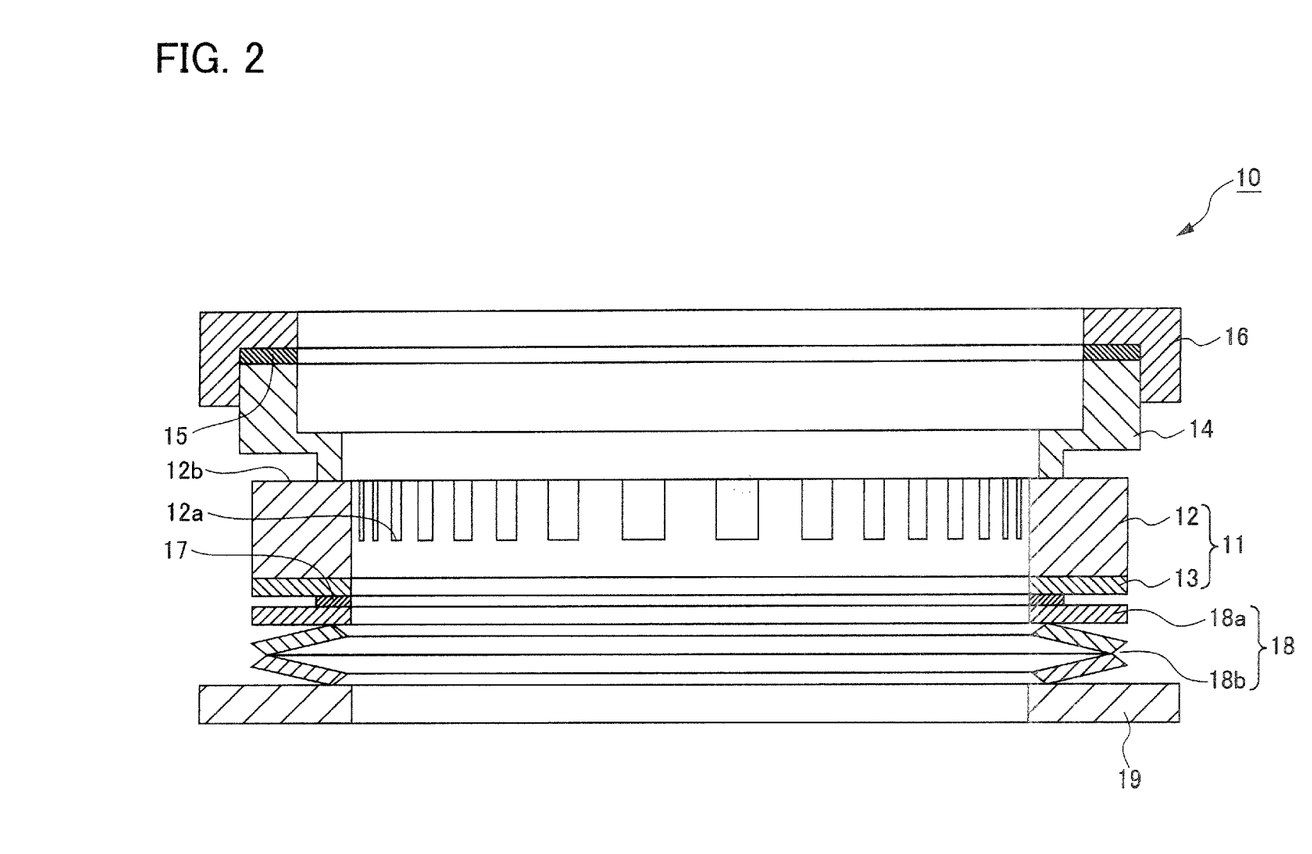
FIG. 2 is a cross-sectional view of an ultrasound motor of the present embodiment.

FIG. 2 is a cross-sectional view of an ultrasound motor 10 of the present embodiment.

The ultrasound motor 10 of the present embodiment is provided with a vibration body 11, a movable body 14, a shock absorber member 15, a supporting body 16, a shock absorber member 17, a pressurizing section 18, a securing member 19 and so on.

The vibration body 11 is provided with an elastic body 12, a piezoelectric body 13 and so on.

The elastic body 12 is a substantially circular ring shaped member formed using a metallic material capable of being elastically deformed such as an iron alloy, e.g. a stainless steel material or an Invar material, brass or the like, one face of which is provided with a piezoelectric body 13 and another face of which is provided with a comb tooth section 12b formed by slotting it to form a plurality of grooves 12a. The apical surface of this comb tooth section 12b is a driving surface in which a progressive wave emerges due to excitation of the piezoelectric body 13 to drive the movable body 14.

The piezoelectric body 13 has a function of converting electric energy into mechanical energy, and in the present embodiment, is formed using PZT (piezoelectric zirconate titanate or lead (Pb) zirconate titanate). This piezoelectric body 13 is formed as a plurality of bodies for each area of an electrode 131 (see FIG. 3A) to which a driving signal is input, and the bodies 13 are sintered onto the elastic body 12. The electrode 131 is electrically connected to a flexible printed board, not shown, and a driving signal supplied from this flexible printed board excites the piezoelectric body 13. The detailed shape of the piezoelectric body 13 of the present embodiment will be described later.

The movable body 14 is a member taking the form of a substantially circular ring, and is brought into pressure-contact with the driving surface of the elastic body 12 by a pressurization force of the pressurizing section 18 described later and is frictionally driven by a progressive wave of the elastic body 12.

The shock absorber member 15 is a substantially circular ring shaped member formed using rubber or the like. This shock absorber member 15 is a member for preventing vibrations of the movable body 14 from being transferred to the side of the supporting body 16, and is provided between the movable body 14 and the supporting body 16.

The supporting body 16 is a member for supporting the movable body 14, and is a member that rotates integrally with the movable body 14 to transfer the rotary movement of the movable body 14 to a driven member (not shown) and regulates the position of the movable body 14 in the direction of a rotational center axis.

The pressurizing section 18 is a part for generating a pressurization force causing the vibration body 11 and the movable body 14 to be brought into pressure-contact with each other, and is provided with a pressurization plate 18a and a disc spring 18b. The pressurization plate 18a is a plate taking the form of a substantially circular ring, which receives the pressurization force generated by the disc spring 18b.

The shock absorber member 17 is a member taking the form of a substantially circular ring, which is formed using a nonwoven fabric, felt or the like. This shock absorber member 17 is a member for preventing the vibrations of the vibration body 11 from being transferred to the side of the pressurizing section 18, and is provided between the piezoelectric body 13 and the pressurization plate 18a.

The securing member 19 is a member for securing the ultrasound motor 10 of the present embodiment to the lens barrel 3.

Herein, the shape of the piezoelectric body 13 is described in more detail.

Figure 3A:
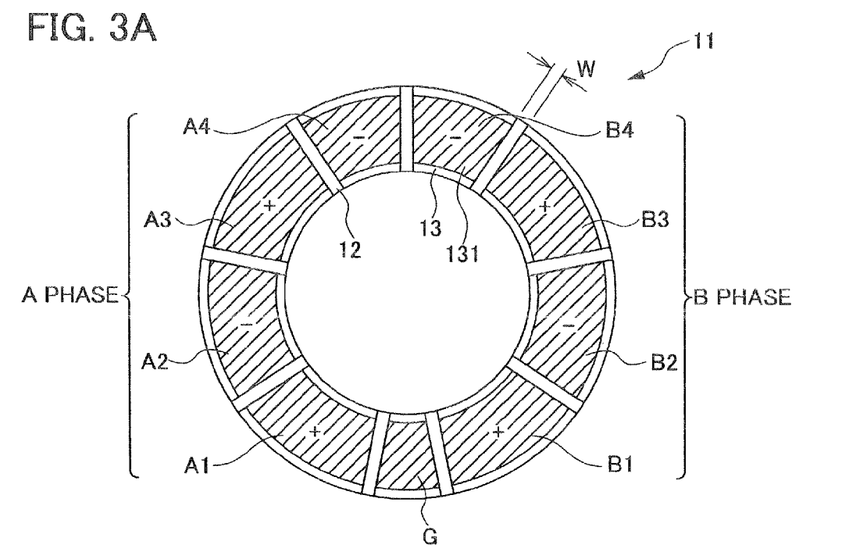
FIG. 3A is a view showing a vibration body of the present embodiment when the vibration body is viewed from the side of the pressurizing section.
Figure 3B:
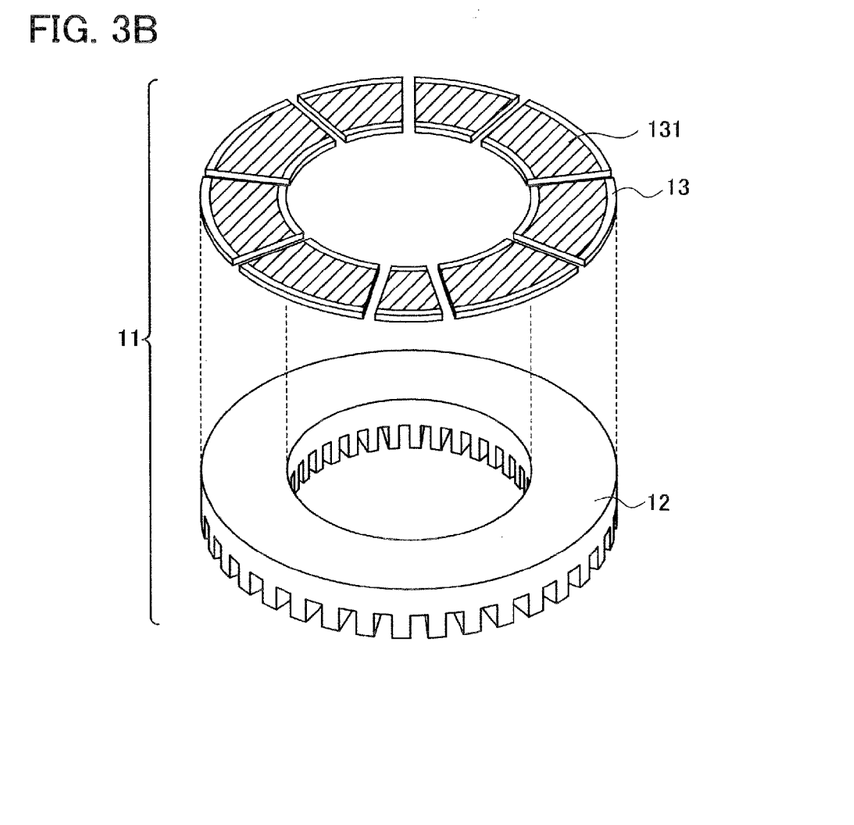
FIG. 3B is a perspective view showing a vibration body of the present embodiment, showing a piezoelectric body and an elastic body in a separated state.

FIG. 3 is a set of illustrations showing the vibration body 11 of the present embodiment. FIG. 3A is an illustration of the vibration body 11 when viewed from the side of the pressurizing section 18, which shows that electrodes 131 are formed in the portions shown by oblique lines. FIG. 3B is a perspective view showing the piezoelectric body 13 and the elastic body 12 separately for the purpose of facilitating understanding.

As shown in FIG. 3, a plurality of the piezoelectric bodies 13 of the present embodiment are independently formed on the surface on the side opposite to the driving surface of the elastic body 12. The manufacturing method for this piezoelectric body 13 and the vibration body 11 will be described later.

As shown in FIG. 3A, the electrodes 131 are formed on the piezoelectric bodies 13. These electrodes 131 are not formed on both ends (the inner peripheral end and outer peripheral end) of the piezoelectric bodies 13 in the radial direction of the elastic body 12, for the purpose of preventing discharge in the polarization process, and the base material portions of the piezoelectric bodies 13 are exposed to the exterior with a predetermined width at both ends of the piezoelectric bodies 13 in the radial direction of the elastic body 12. On the other hand, the electrode 131 is formed on both ends of the piezoelectric body 13 in the circumferential direction of the elastic body 12.

In addition, the piezoelectric body 13 is not formed between the adjacent electrodes 131 in the circumferential direction of the elastic body 12, and when the vibration body 11 is viewed from the side of the pressurizing section 18, it leads to a configuration in which the elastic body 12 is visible. It should be noted that the outside diameter of the elastic body and the piezoelectric body is about 12 mm, and the inside diameter of the same is about 8 mm, in the present embodiment. In this case, the formation is preferably made so that the gap W between the adjacent electrodes 131 (piezoelectric bodies 13) is about 0.1 mm or less from the viewpoint of improvement of the driving efficiency. In the present embodiment, W=0.05 mm.

These piezoelectric bodies 13 are separated to form parts receiving signals of two phases (A phase and B phase), and in the part corresponding to each respective phase, elements of different polarities (A1, A2, A3, A4, B1, B2, B3, B4) are lined up in such a manner that polarization directions are arranged alternately for each half-wavelength. Additionally, a portion having an interval of ¼ wavelength between the A phase and the B phase corresponds to the ground (G).

A manufacturing method for the vibration body 11 of the present embodiment will now be described.

Figure 4:
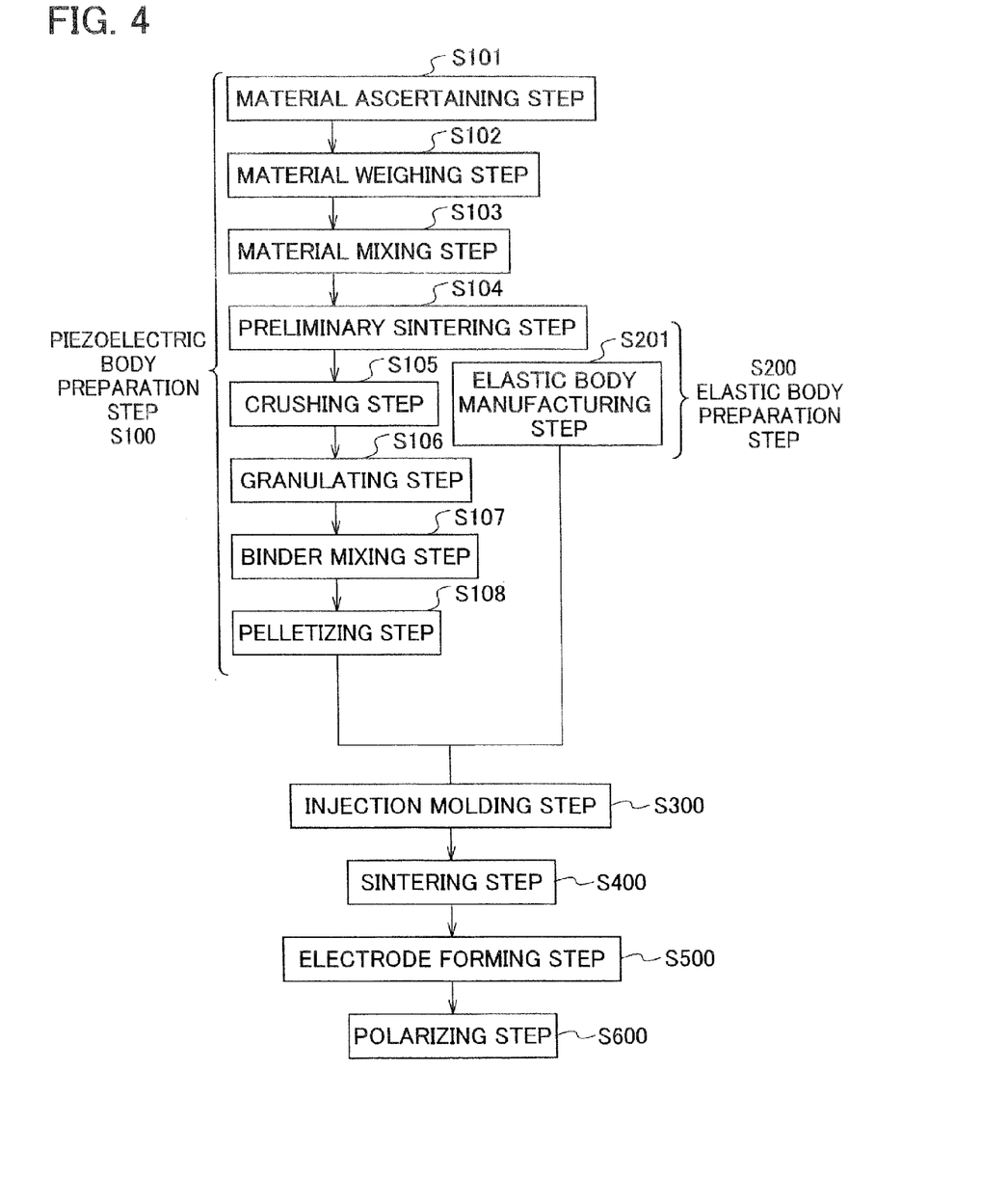
FIG. 4 is a process chart showing a manufacturing method for a vibration body of the present embodiment.

FIG. 4 is a process chart showing the method of manufacturing the vibration body 11 of the present embodiment.

The manufacturing process of the vibration body 11 is provided with a piezoelectric body preparation step S100, an elastic body preparation step S200, an injection molding step S300, a sintering step S400 and an electrode forming step S500 and a polarizing step S600.

As shown in FIG. 4, the piezoelectric body preparation step S100 is provided with a material ascertaining step S101, a material weighing step S102, a material mixing step S103, a preliminary sintering step S104, a crushing step S105, a granulating step S106, a binder mixing step S107 and a pelletizing step S108.

The material ascertaining step S101 is a step of ascertaining the properties of the material of the PZT, in which for example an X-ray fluorescence apparatus is used to check whether or not the purity of the PZT is equal to or more than 99.90%.

The material weighting step S102 is a step of measuring the weight of the raw material of the PZT, in which for example a precision balance is used to check whether or not the weight of a raw material of the PZT corresponds to a predetermined target value within a margin of error of 0.1 g or less.

The material mixing step S103 is a step of mixing the raw material of the PZT and a predetermined material necessary for sintering, in which for example a ball mill is used to carry out the mixing for a predetermined amount of time (in the present embodiment, two hours). Then, a particle size distribution analyzer is used to check whether or not the particle diameter of the mixture ranges from 1 to 2 μm.

The preliminary sintering step S104 is a step of preliminarily sintering the mixture, in which the preliminary sintering is performed while for example a temperature recorder and/or a temperature history sensor is used to check whether or not the profile (setting) of the temperature is within a range of ±5° C. from 850° C.

The crushing step S105 is a step of crushing the preliminarily sintered object, in which for example a ball mill is used to carry out the crushing for a predetermined amount of time. Then it is ascertained whether or not the particle diameter of the crushed object is between 1 to 2 μm, using a particle size distribution analyzer. In addition, an X-ray diffraction device is used to check the ratio of the PZT included in the crushed object from a crystalline phase of the PZT, and a specific surface area measuring instrument is used to check whether or not the specific surface area of the crushed object has a predetermined value (in the present embodiment, 3 cm$^2$/g).

The granulating step S106 is a step of solidifying the powder of the crushed object to granulate it. Herein, for example a spray dryer is used to dry the crushed object at a predetermined temperature (in the present embodiment, 200° C.), and subsequently a predetermined amount of PVA (polyvinyl alcohol) is added thereto to carry out the granulation. At this time, an SEM (scanning electron microscope) is used to check whether or not the diameter of the resultant granular particles has a predetermined value (in the present embodiment, between 30 and 100 μm) and whether or not the PVA shows a predetermined ratio.

The binder mixing step S107 is a step of mixing the granulated object with a predetermined amount of predetermined binder, in which, for example a precision balance is used to check whether or not the total weight of the mixture has an error of 1 g or less from a predetermined target value. In the present embodiment, PVB (polyvinyl butyral) is used as the binder.

The pelletizing step 108 is a step of pelletizing (solidifying to make granular) the mixture, in which for example, a pellet producing machine is used.

The elastic body preparation step S200 is provided with an elastic body manufacturing step S201 for manufacturing the elastic body 12. In the present embodiment, the elastic body 12 is made by a cutting work process.

Figure 5:
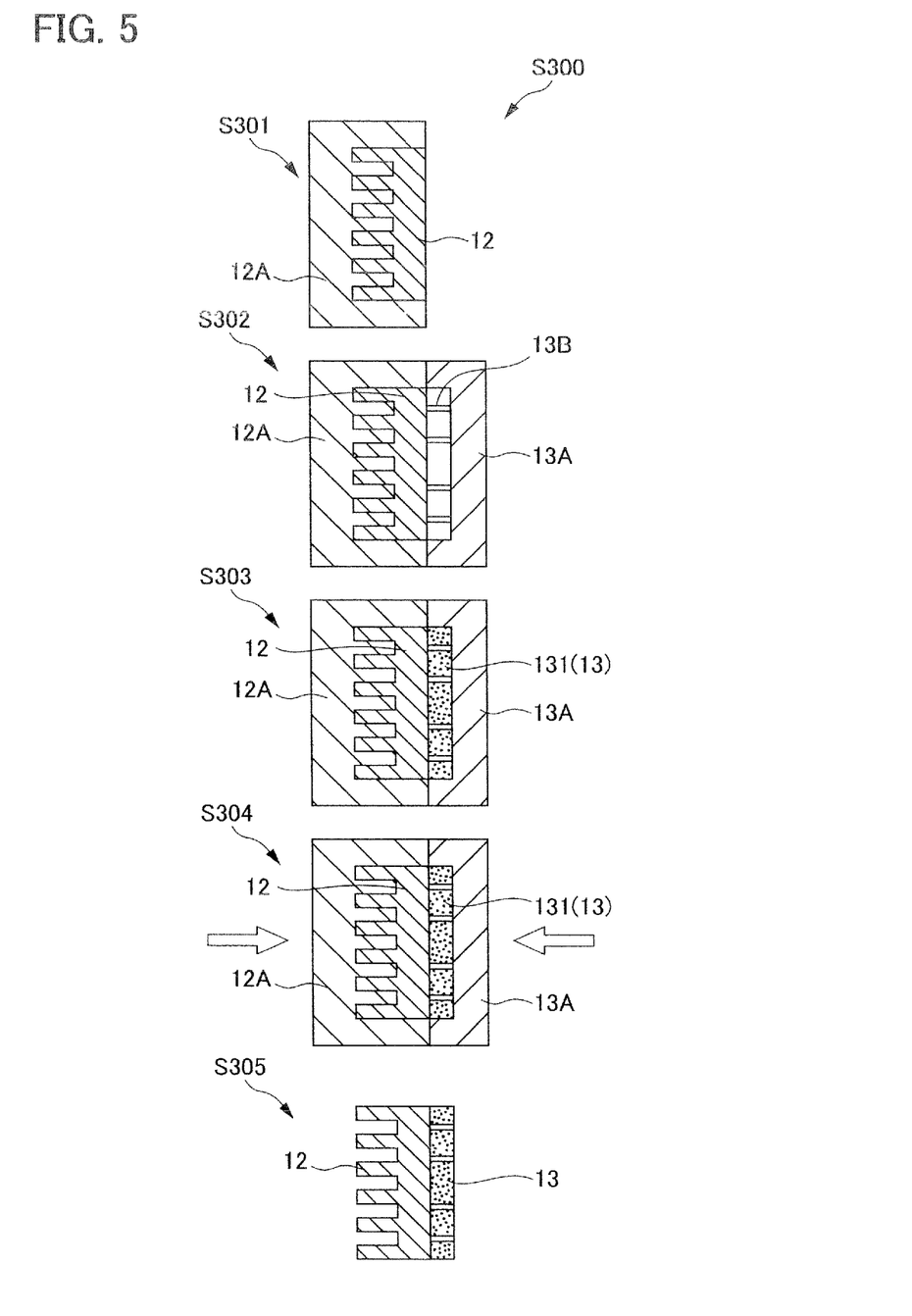
FIG. 5 is a schematic diagram for explaining an injection molding process in detail.

The injection molding step S300 is a step of melting the pelletized mixture to curry out injection molding. FIG. 5 is a schematic diagram for explaining this injection molding step S300 in more detail. In the injection molding step S300, the elastic body 12 manufactured in the elastic body preparation step S200 is placed in an elastic body forming mold 12A, as shown in the figure (S301).

Subsequently, a piezoelectric element forming mold 13A is placed in opposition to the elastic body forming mold 12A (S302). This piezoelectric element forming mold 13A is provided with partitions 13B for separating a cavity into which the pelletized mixture is injected into a plurality of regions.

The partitions 13B are in contact with a surface of the elastic body 12 in the state, shown in S302 in FIG. 5, that the piezoelectric element forming mold 13A is placed in opposition to the elastic body forming mold 12A. The pelletized mixture is injected and molded into each region delimited by the partitions 13B (S303). It should be noted that this injection molding is performed while an injection molding machine is used to check, for example, whether the temperature of the mixture is between 160 and 170° C., whether the pressure-maintaining pressure has a predetermined value, and/or whether a pressure holding time has a predetermined value, and the like.

Then, extra pressure is applied between the elastic body forming mold 12A and the piezoelectric element forming mold 13A so as to pressurize the elastic body 12 and the piezoelectric element 13 (S304). The pressurization value is preferably on the order of 0.5 t/cm$^2$. It should be noted that this step may be omitted if the elastic body 12 and the piezoelectric element 13 are sufficiently pressurized during the injection (if the pressurization value is on the order of 0.5 t/cm$^2$).

The elastic body 12 and the piezoelectric element 13 are removed from the elastic body forming mold 12A and the piezoelectric element forming mold 13A (S305). It should be noted that after the injection molding step S300, there is a resin removal step for removing the resin binder that has become unnecessary, for example wherein the resin removal is performed by a pyrolytic method or the like.

Returning to FIG. 4, the sintering step S400 is a step of heating the elastic body 12 and piezoelectric body 13 integrally formed in the injection molding step S300 so as to sinter the piezoelectric body 13, in which the sintering temperature of the sintering step is preferably between 1000 and 1200° C. The sintering step S400 is performed while for example a temperature recorder and/or a temperature history sensor is used to check whether or not the profile of the temperature is within a range of ±10° C. from 1100° C. In addition, after completion of the sintering, a precision balance is used to check whether or not the sintered density has a predetermined value, and an SEM is used to check whether or not the diameter of a crystalline particle has a predetermined value (in the present embodiment, on the order of 2 μm). By this sintering step S400, the mixture for the piezoelectric body becomes the sintered body of the piezoelectric body 13, and is bonded completely to the elastic body 12.

The electrode forming step S500 is a step of forming an electrode on the piezoelectric body 13, in which for example a screen printing machine is used to form the electrodes 131 based on a printing process. In addition, an SEM is used to check whether or not the film thickness of the printed electrodes 131 is between 2 and 5 μm.

The polarizing step S600 is a step of polarizing the piezoelectric body 13, in which for example a predetermined power supply is used to apply a voltage of 25 kV/cm$^2$ to the body 13. Additionally, a thermometer is used to adjust the temperature of the piezoelectric body 13 at the time of polarization to 100° C., and a timer is used to apply the voltage to the body 13 for 30 minutes. It should be noted that the polarization needs to be performed with the piezoelectric body 13 being sandwiched between a positive electrode and a negative electrode, but in the present embodiment, the electrode 131 formed by the printing process is used as one of the electrodes and the elastic body 12 is used as the other.

After the polarizing step S600, polishing processing and the like are carried out for maintaining the planarity of the driving surface of the elastic body 12 if necessary, and then the vibration body 11 of the present embodiment is completed. After that, the ultrasound motor 10 of the present embodiment is completed through an assembly step of assembling the ultrasound motor 10 and/or any other step.

The method of forming the electrodes on the substantially circular ring shaped piezoelectric body as in the prior art has to provide a predetermined interval between the electrodes in order to prevent discharge at the time of polarization processing of the piezoelectric body. Accordingly, between the electrodes of the piezoelectric body, there is a base material portion of the piezoelectric body, in which no electrode is formed. This base material portion of the piezoelectric body has no electrode formed, and thereby remains unpolarized even if the polarization processing is carried out.

For this reason, there has been the problem that when providing a driving signal for driving an ultrasound motor to each electrode, the piezoelectric body in the area in which the electrode is formed expands and contracts in dependence upon the driving signal but the base material portion of the piezoelectric body does not expand and contract and accordingly there is no contribution to the excitation of the elastic body, and there is a base material portion of the piezoelectric body between the electrodes, so that the expansion and contraction of the piezoelectric body in the area in which the electrode is formed are inhibited, interfering with excitation of the elastic body, thereby introducing a cause of a reduction in driving efficiency of the ultrasound motor.

In contrast to this, according to the present embodiment, a plurality of the piezoelectric bodies 13 are formed for areas corresponding to the electrodes 131 on an area-by-area basis, so that there is no area of the piezoelectric body which remains unpolarized between the electrodes 131, and this avoids the inhibition of the expansion and contraction of the piezoelectric body 13 in an area in which the electrode 131 is formed, thereby making it possible to expect an improvement of the driving efficiency of the ultrasound motor 10.

Furthermore, in the method of forming the electrodes on a substantially circular ring shaped piezoelectric body as in the prior art, if the polarization processing is performed one-by-one for each of the electrodes in order to prevent discharge at the time of the polarization process, then a piezoelectric body in one of the areas in which the electrode is formed expands and the piezoelectric body in the other area contracts, and the base material portion of the piezoelectric body between the electrodes in which the electrode is not formed is not deformed, so that the piezoelectric body which has been subjected to the polarization process is deformed and takes an awkward shape.

For this reason, it has been necessary to carry out the polarization simultaneously for a plurality of electrodes formed on the piezoelectric body, and for the simultaneous polarization for the plurality of electrodes, it has been necessary to provide a predetermined interval between the adjacent electrodes in order to prevent discharge. The interval (corresponding to W in FIG. 3A) between the adjacent electrodes provided for this prevention of discharge was between 0.4 and 0.5 mm.

According to the present embodiment, however, the piezoelectric body 13 is independently formed for each electrode 131, so that it cannot be deformed even if the polarization process is carried out for each electrode 131. Therefore, according to the present embodiment, it is not required to polarize all the electrodes simultaneously, thereby making it possible to reduce the interval between the adjacent electrodes.

According to the present embodiment, since the interval between the adjacent electrodes 131 (piezoelectric bodies 13) is set to W=0.05 mm, the total area of the electrodes 131 accordingly increases by about 6% and the area of the piezoelectric bodies 13 contributing to the excitation of the elastic body 12 increases.

As a result, the effect of exciting the elastic body 12 is enhanced, and an improvement of the driving efficiency of the ultrasound motor can be expected.

It should be noted that, from the standpoint that discharge is to be prevented during the polarization, the present embodiment is intended to perform the polarization processing in such a manner that the piezoelectric bodies 13 that are adjacent to each other and polarize for different polarities (polarization directions) are polarized separately for each polarity.

Moreover, in the manufacturing method of bonding the piezoelectric body and the elastic body using an adhesive as in the prior art, the piezoelectric body 13 requires the steps of washing and drying of components, applying an adhesive, securing by a securing jig, thermally curing, removing the securing jig and so on, as well as several controls during the steps, including the amount of adhesive applied, the temperature of the adhesive, the amount of pressurization, the pressurization time, the curing temperature, the curing time and so on.

According to the present embodiment, however, the piezoelectric body 13 is made integrally with the elastic body 12 by the injection molding step S300 that is one of the manufacturing steps for the piezoelectric body 13, and their complete bonding can be accomplished by the sintering step without using an adhesive or the like, so that the number of process steps is reduced and various kinds of controls as described above can be eliminated, thereby making it possible to easily perform the manufacture of the vibration body 11 and consequently the manufacture of the ultrasound motor 10.

In addition, a vibration body in which the piezoelectric body and the elastic body are bonded with an adhesive as in the prior art has led to problems in that the vibrations are attenuated by the presence of the layer of adhesive between the piezoelectric body and the elastic body, and in that to ensure sufficient adhesive strength, the material of the adhesive must be selected, a process must be carried out to roughen a surface of the elastic body to which the piezoelectric body is bonded, and/or other requirements had to be met.

However, according to the present embodiment, the piezoelectric body 13 and the elastic body 12 are directly bonded and thus there is nothing interfering with the transfer of vibrations between the piezoelectric body 13 and the elastic body 12, so that the elastic body 12 can be excited efficiently. Besides, according to the present embodiment, the piezoelectric body 13 is bonded to the elastic body 12 by sintering, so that the piezoelectric body 13 and the elastic body 12 can be easily bonded in an integrated fashion with sufficient bonding strength.

Furthermore, if the piezoelectric body 13 as in the present embodiment is to be formed by means of cutting a substantially circular ring shaped piezoelectric body in a predetermined shape or by other means, such processing as cutting or the like is difficult because the piezoelectric body 13 has a brittle nature.

On the contrary, according to the present embodiment, it is possible to manufacture the piezoelectric body 13 easily.
(Modification)

(1) The piezoelectric body forming mold 13A in the present embodiment has cavity sections completely separated in a plurality of areas, based on a situation where the partitions 13B are in contact with the elastic body 12 when the mold 13A is placed opposite to the elastic body 12. The foregoing has been given by way of an example for which a plurality of separate piezoelectric bodies 13 are independently formed on the respective separate areas, by injecting and molding a material of the piezoelectric body into the separate areas, respectively.

However, the piezoelectric body may be formed in the following manner. For example, the height of the partition may be decreased to form a clearance between the surface of the elastic body and the partition when the piezoelectric body forming mold is brought into contact with the elastic body. In the piezoelectric body formed in this manner, the adjacent piezoelectric bodies are not completely separated, but they are continuous on the elastic body side and become one piezoelectric body essentially separated into a plurality of regions by a groove. In this way, the mixture can flow into the other regions from the clearance when injecting the mixture. Therefore, it is possible to inject the mixture into the whole cavity portion, for example even if the injection outlet is at a single location, and thus the injection can be carried out easily and uniformly.

(2) Moreover, it is possible that no partition to the piezoelectric body forming mold is provided. In this case, the piezoelectric body forming mold is formed to have a cavity section taking the shape of a circular ring without any partition. The piezoelectric body is divided into a plurality of regions by injecting the mixture into the cavity section and radially trimming parts of the circular ring shaped piezoelectric body formed on the elastic body.

(3) In the present embodiment, the piezoelectric body 13 was molded by placing the piezoelectric body forming mold 13A on the elastic body forming mold 12A in opposition to the mold 12A and by injecting the mixture therein. However, the piezoelectric body may be manufactured differently from the elastic body, and may adhere to the elastic body. In this case, the piezoelectric body may be manufactured solely by injection molding, or may be manufactured by stamping it out with a die from a sheet-formed material. Furthermore, the piezoelectric body may be manufactured by slicing a cylindrical body.

Alternatively, the piezoelectric body manufactured in these ways may be in a circular ring shape, and may have a shape obtained by dividing the circular ring into a plurality of segments.

In the case of the circular ring shaped piezoelectric body, the piezoelectric body may adhere to the elastic body and then the piezoelectric body may be divided into a plurality of areas by trimming parts of the piezoelectric body in a radial line formation. In this case, positioning for bonding the piezoelectric body on the elastic body is easy.

Alternatively in the case of a piezoelectric body in which the circular ring is divided into a plurality of segments, the piezoelectric body is made to adhere to the elastic body in such a manner that the piezoelectric body becomes a substantially circular ring shaped as a whole. In this case, it is possible to omit efforts to trim the piezoelectric body to divide it.

(4) Although the description in the present embodiment has been made by way of an example in which the electrode 131 is not formed on both ends of the piezoelectric body 13 in the radial direction of the elastic body 12, the present invention is not limited to this, and for instance the electrode 131 may be formed over the whole area of the piezoelectric body 13. In this case, it is preferable to provide a solution for preventing discharge during the polarization process.

(5) The description in the present embodiment has been given by way of an example in which a rotational type ultrasound motor 10 whose movable body 14 is rotationally driven is used as a vibration actuator, but the invention is not limited to this and the actuator may be a linear type ultrasound motor. Alternatively, the actuator may be an actuator of a rod type, pencil type, disc type or the like.

(6) In the present embodiment, the description has been given by way of an example in which the ultrasound motor 10 is used as a vibration actuator, but the invention is not limited to this, and for example the actuator may be a vibration actuator utilizing any vibration other than that in an ultrasonic range.

(7) In the present embodiment, the description has been given by way of an example of use of the ultrasound motor 10 as a driving source for the auto focusing of the camera 1, but the invention is not limited to this, and for example the motor 10 can be applied to a driving source for the zoom operation of a camera, a driving source for a blur-correcting mechanism for correcting blurring caused by the hand of the photographer by driving a part of an image pickup system of a camera, a driving section for a copy machine, a steering wheel tilting apparatus for an automobile, a driving device for a clock/watch and so on.

It should be noted that the present embodiment and the modifications can be used in various combinations as appropriate, but the details of such combinations are omitted from the description.

What is claimed is:
1. A manufacturing method for a vibration body, comprising:
a first step of providing an electromechanical transducer element on an elastic body in a state that the element is divided into a plurality of independent areas by a groove-shaped border portion;

a second step of sintering the elastic body and the electromechanical transducer element;

a third step of forming electrodes on a surface of the plurality of areas of the electromechanical transducer element; and a fourth step of polarizing the electromechanical transducer element for each of the plurality of areas; wherein in the first step, the electromechanical transducer element is formed by injection molding, and in the injection molding, the elastic body and a piezoelectric element are pressurized, and in the fourth step, the electromechanical transducer element is polarized using the electrodes formed in the third step and the elastic body as electrodes.

2. The manufacturing method for a vibration body according to claim 1, wherein the first step provides the electromechanical transducer element by injection molding.

3. The manufacturing method for a vibration body according to claim 1, wherein in the first step, the electromechanical transducer element is provided such that an interval between adjacent areas of the plurality of areas on a surface of the electromechanical transducer element is 0.1 mm or less.

4. The manufacturing method for a vibration body according to claim 1, wherein a movable body is provided in pressure-contact with a first face of the elastic body, the first face being opposite to a second face of the elastic body where the electromechanical transducer element is provided.

5. The manufacturing method for a vibration body according to claim 4, wherein a pressurizing section generating a pressurizing force to pressure-contact the elastic body and the movable body is provided on the second face side of the elastic body on which the electromechanical transducer element is provided.

* * * * *